(12) United States Patent
Fagg (10) Patent No.: US 8,130,020 B2
(45) Date of Patent: Mar. 6, 2012

(54) SWITCHED-CAPACITOR DECIMATOR

(75) Inventor: Russell Fagg, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 189 days.

(21) Appl. No.: 12/120,207

(22) Filed: May 13, 2008

(65) Prior Publication Data

US 2009/0284285 A1    Nov. 19, 2009

(51) Int. Cl.
G06F 7/64   (2006.01)
G06G 7/18   (2006.01)
G06G 7/19   (2006.01)
(52) U.S. Cl. ........................................ 327/337; 327/336
(58) Field of Classification Search .................. 327/337, 327/91, 94, 336, 552, 554; 455/341
See application file for complete search history.

(56) References Cited

U.S. PATENT DOCUMENTS

| 4,653,017 | A | 3/1987 | Colbeck et al. | |
|---|---|---|---|---|
| 5,973,536 | A * | 10/1999 | Maejima | 327/337 |
| 6,614,374 | B1 | 9/2003 | Gustavsson et al. | |
| 6,897,801 | B2 * | 5/2005 | Confalonieri et al. | 341/172 |
| 7,088,147 | B2 | 8/2006 | Prasad et al. | |
| 7,224,203 | B2 * | 5/2007 | Hazucha et al. | 327/337 |
| 7,423,458 | B2 * | 9/2008 | Aghtar | 327/91 |
| 2008/0214946 | A1 * | 9/2008 | Miller et al. | 600/516 |

OTHER PUBLICATIONS

International Search Report and Written Opinion—PCT/US2009/043669, International Search Authority—European Patent Office—Sep. 9, 2009.

Nathaniel J Guilar et al: "A Passive Switched-Capacitor Finite-Impulse-Response Equalizer" IEEE Journal of Solid-State Circuits, IEEE Service Center, Piscataway, NJ, US, vol. 42, No. 2, Feb. 1, 2007, pp. 400-409, XP011161671 ISSN: 0018-9200 p. 401; figures 3,3 p. 403, left-hand column-p. 404, left-hand column; figures 6,7.

Saska Lindfors et;al: "A 3-V 230-MHz CMOS Decimation Subsampler" IEEE Transactions on Circuits and Systems II: Express Briefs, IEEE Service Center, New York, NY, US, vol. 50, No. 3, Mar. 1, 2003, pp. 105-117, XP011071652 ISSN: 1057-7130 abstract p. 110, right-hand column-p. 112, left-hand column; figure 10.

Wang Ping et al: "A CMOS 1.0-[mu]m Two-Dimensional Analog Multirate System for Real-Time Image Processing" IEEE Journal of Solid-State Circuits, IEEE Service Center, Piscataway, NJ, US, vol. 32, No. 7, Jul. 1, 1997, XP011060521 ISSN: 0018-9200 p. 1038, right-hand column-p. 1041, right-hand column; figures 2-5.

* cited by examiner

*Primary Examiner* — Lincoln Donovan
*Assistant Examiner* — Diana J Cheng
(74) *Attorney, Agent, or Firm* — Larry J. Moskowitz; Eric Ho (57) ABSTRACT

A switched-capacitor decimator that can attenuate undesired signal components at odd harmonics of an output sample rate is described. In one design, the switched-capacitor decimator includes at least one sampling capacitor and multiple switches. For each sampling capacitor, the top plate is charged with a first input signal when the capacitor is selected for top charging, and the bottom plate is charged with a second input signal when the capacitor is selected for bottom charging. For each sampling capacitor, the top plate provides its stored charges to a first output signal and the bottom plate provides its stored charges to a second output signal when the capacitor is selected for reading. The switches couple the at least one sampling capacitor to the first and second input signals for charging and to the first and second output signals for reading.

30 Claims, 8 Drawing Sheets

SWITCHED-CAPACITOR DECIMATOR

BACKGROUND

I. Field

The present disclosure relates generally to electronics, and more specifically to a decimator.

II. Background

A decimator is a circuit block that receives an input signal at an input sample rate and provides an output signal at an output sample rate that is a fraction of the input sample rate. The decimation process may result in undesired signal components at harmonics of the output sample rate to fall within a desired signal bandwidth. These undesired signal components would then act as noise that may degrade performance. An anti-alias filter may be placed prior to the decimator and may be used to attenuate the undesired signal components that can fall within the desired signal bandwidth. The anti-alias filter may be relatively complex depending on the input and output sample rates and the desired amount of attenuation of the undesired signal components. It is desirable to perform decimation in a manner that can reduce hardware complexity.

SUMMARY

A switched-capacitor decimator that can attenuate certain undesired signal components that may fall within the desired signal bandwidth due to decimation is described herein. The switched-capacitor decimator can sample a differential input signal onto both top and bottom plates of at least one sampling capacitor. This top and bottom sampling may attenuate undesired signal components at odd harmonics of the output sample rate, which may relax the requirements of an anti-alias filter.

In one design, the switched-capacitor decimator includes at least one sampling capacitor and a plurality of switches. For each sampling capacitor, the top plate is charged with a first input signal when the capacitor is selected for top charging, and the bottom plate is charged with a second input signal when the capacitor is selected for bottom charging. Top charging refers to charging the top plate of a capacitor, and bottom charging refers to charging the bottom plate of a capacitor. For each sampling capacitor, the top plate provides its stored charges to a first output signal and the bottom plate provides its stored charges to a second output signal when the capacitor is selected for reading. The switches couple the at least one sampling capacitor to the first and second input signals for charging and to the first and second output signals for reading. The switched-capacitor decimator may further include an input capacitor coupled between the first and second input signals and/or an output capacitor coupled between the first and second output signals. The first and second input signals may be for a differential input signal at the input sample rate. The first and second output signals may be for a differential output signal at the output sample rate, which may be a fraction of the input sample rate.

In one design, the switched-capacitor decimator includes one sampling capacitor and four switches. A first switch couples the first input signal to the top plate of the sampling capacitor when selected for top charging. A second switch couples the second input signal to the bottom plate of the sampling capacitor when selected for bottom charging. A third switch couples the top plate of the sampling capacitor to the first output signal when selected for reading. A fourth switch couples the bottom plate of the sampling capacitor to the second output signal when selected for reading.

In another design, the switched-capacitor decimator includes two sampling capacitors and eight switches. The first and second switches couple the first input signal to the top plates of the first and second sampling capacitors, respectively, when they are selected for top charging. The third and fourth switches couple the second input signal to the bottom plates of the first and second sampling capacitors, respectively, when they are selected for bottom charging. The fifth and sixth switches couple the top plates of the first and second sampling capacitors, respectively, to the first output signal when they are selected for reading. The seventh and eight switches couple the bottom plates of the first and second sampling capacitors, respectively, to the second output signal when they are selected for reading.

In yet another design, the switched-capacitor decimator includes four sampling capacitors and 16 switches. Four switches couple the first input signal to the top plates of the four sampling capacitors when they are selected for top charging. Another four switches couple the second input signal to the bottom plates of the four sampling capacitors when they are selected for bottom charging. Yet another four switches couple the top plates of the four sampling capacitors to the first output signal when they are selected for reading. The last four switches couple the bottom plates of the four sampling capacitors to the second output signal when they are selected for reading.

In each of the designs described above, for each sampling capacitor, additional switches may be used to couple the plate not being charged to a reference voltage when the other plate is being charged. The switches in the switched-capacitor decimator may be operated as described below. Various aspects and features of the disclosure are also described in further detail below.

DETAILED DESCRIPTION

The switched-capacitor decimator described herein may be used for various applications such as wireless communication, computing, networking, consumer electronics, etc. The switched-capacitor decimator may also be used for any device that performs decimation from a higher sample rate to a lower sample rate. The switched-capacitor decimator may be used for various devices such as wireless communication devices, cellular phones, broadcast receivers, personal digital assistants (PDAs), handheld devices, wireless modems, laptop computers, cordless phones, Bluetooth devices, consumer electronics devices, etc. For clarity, the use of the switched-capacitor decimator in a wireless communication device, which may be a cellular phone or some other device, is described below. The switched-capacitor decimator may be used in a receiver where sub-sampling of interferers existing in alias frequency bands to within the desired signal between is to be avoided.

Figure 1:
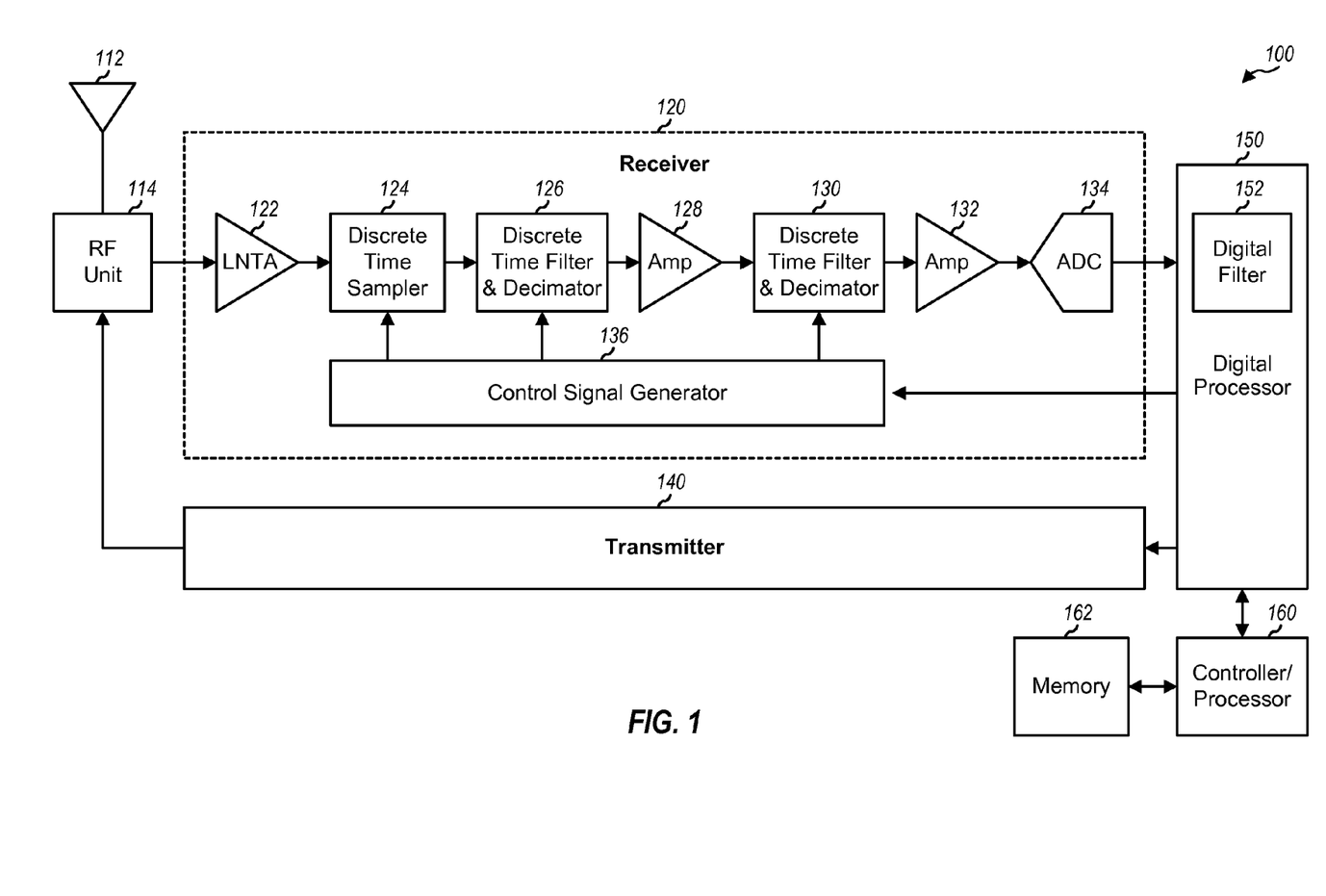
FIG. 1 shows a block diagram of a wireless communication device.

FIG. 1 shows a block diagram of a design of a wireless communication device 100. In this design, wireless device 100 includes a receiver 120 and a transmitter 140 that support bi-directional communication. In general, wireless device 100 may include any number of receivers and any number of transmitters for any number of communication systems and frequency bands.

On the receive path, an antenna 112 receives radio frequency (RF) modulated signals transmitted by base stations and provides a received RF signal, which is routed through an RF unit 114 and provided to receiver 120. RF unit 114 may include an RF switch and/or a duplexer that can multiplex RF signals for the transmit and receive paths. Within receiver 120, a low noise transconductance amplifier (LNTA) 122 amplifies the received RF signal (which may be a voltage signal) and provides an amplified RF signal (which may be a current signal). A discrete time sampler 124 samples the amplified RF signal and provides analog samples. A discrete time filter and decimator block 126 filters and decimates the analog samples and provides first filtered samples. An amplifier (Amp) 128 amplifies the first filtered samples and provides first amplified samples. A discrete time filter and decimator block 130 filters and decimates the first amplified samples and provides second filtered samples. An amplifier 132 amplifies the second filtered samples and provides second amplified samples. An analog-to-digital converter (ADC) 134 digitizes the second amplified samples and provides digital samples to a digital processor 150. The digital samples may be processed by a digital filter 152 and/or other processing units within digital processor 150. A control signal generator 136 generates a sampling clock for sampler 124 and control signals for blocks 126 and 130.

On the transmit path, digital processor 150 processes data to be transmitted and provides output chips to transmitter 140. Transmitter 140 processes (e.g., converts to analog, filters, amplifies, and frequency upconverts) the output chips to generate an output RF signal, which is routed through RF unit 114 and transmitted via antenna 112. For simplicity, details of transmitter 140 are not shown in FIG. 1.

Digital processor 150 may include various processing units for data transmission and reception as well as other functions. For example, digital processor 150 may include a digital signal processor (DSP), a reduced instruction set computer (RISC) processor, a central processing unit (CPU), etc. A controller/processor 160 may control the operation at wireless device 100. A memory 162 may store program codes and data for wireless device 100. Data processor 150, controller/processor 160, and/or memory 162 may be implemented on one or more application specific integrated circuits (ASICs) and/or other ICs.

FIG. 1 shows a specific design of receiver 120. In general, the processing of the signals within receiver 120 may be performed by one or more stages of amplifier, filter, decimator, sampler, etc. These circuit blocks may be arranged differently from the configuration shown in FIG. 1. Furthermore, other circuit blocks not shown in FIG. 1 may also be used to process the signals within the receiver. For example, multiple stages of variable gain amplifier (VGA) and lowpass filter may be located between discrete time sampler 124 and ADC 134. Some circuit blocks in FIG. 1 may also be omitted. For example, block 130 and amplifier 132 may be omitted, and amplifier 128 may directly drive ADC 134. All or a portion of receiver 120 may be implemented on one or more RF integrated circuits (RFICs), mixed-signal ICs, etc.

Figure 2:
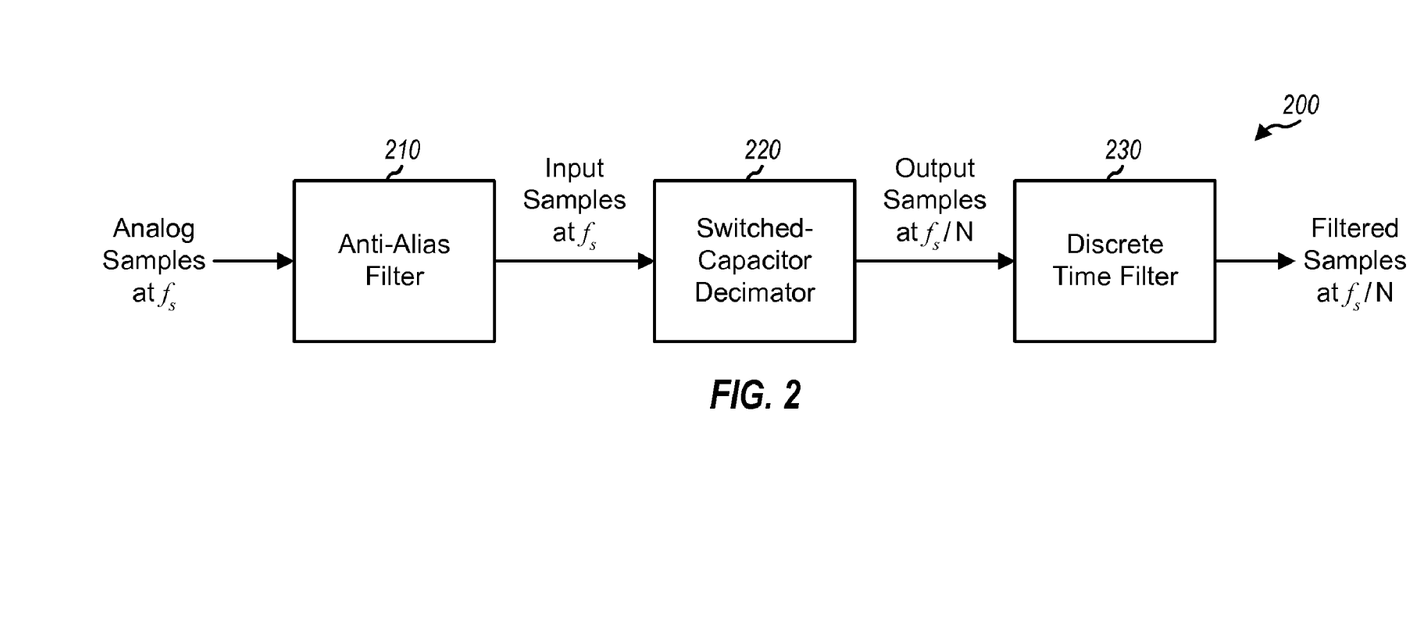
FIG. 2 shows a block diagram of a discrete time filter and decimator block.

FIG. 2 shows a block diagram of a design of a discrete time filter and decimator block 200, which may be used for each of blocks 126 and 130 in FIG. 1. Within block 200, an anti-alias filter 210 receives analog samples at an input sample rate of $f_s$, filters the analog samples to attenuate undesired signal components that can fold within the desired signal bandwidth due to the subsequent decimation, and provides input samples at the input sample rate. A switched-capacitor decimator 220 receives and decimates the input samples by a factor of N and provides output samples at an output sample rate of $f_{out} = f_s/N$, where N may be any integer value. A discrete time filter 230 filters the output samples from decimator 220 and provides filtered samples at the output sample rate. The terms "samples" and "signals" are used interchangeably herein.

Figure 3A:
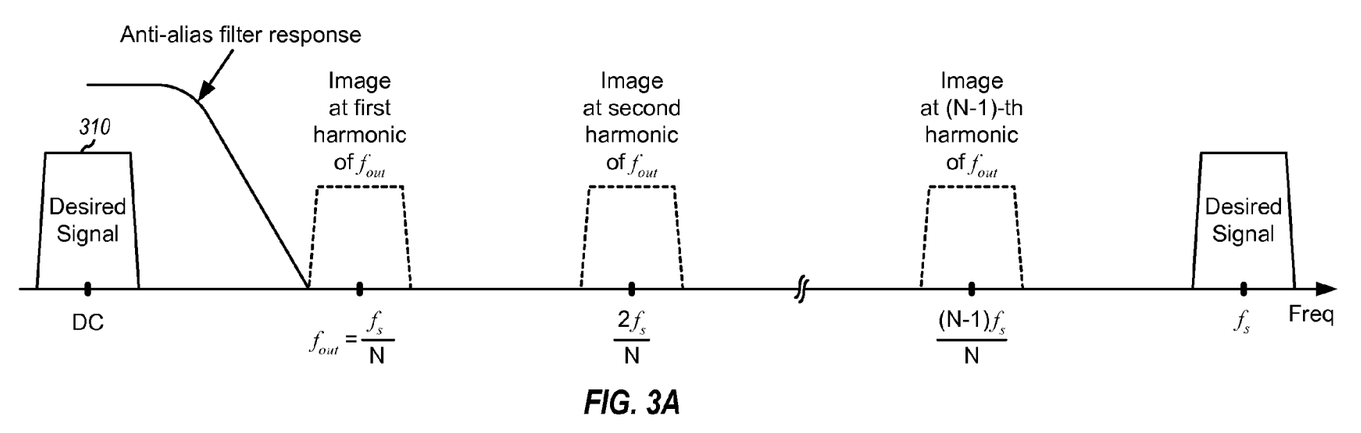
FIG. 3A shows a spectral plot for conventional decimation.

FIG. 3A shows a spectral plot for conventional decimation. The input signal for a decimator includes a desired signal 310 having a two-sided bandwidth of $f_{signal}$ and occupying frequencies in the range of $-f_{signal}/2$ to $+f_{signal}/2$. Since the input signal is at the input sample rate of $f_s$, the spectrum of the input signal repeats every $f_s$. Decimation by a factor of N results in undesired signal components centered at every harmonic of the output sample rate, which is $m \cdot f_s/N$, for $m=1, \ldots, N-1$, to be folded down to DC. This aliasing results in the undesired signal components overlapping the desired signal and acting as noise to the desired signal.

Anti-alias filter 210 in FIG. 2 may attenuate the undesired signal components at all harmonics of the output sample rate. This would then result in small amounts of undesired signal components falling within the desired signal bandwidth due to decimation. Anti-alias filter 210 may be designed to have (i) a relatively flat passband in order to avoid distorting the frequency response of the desired signal and (ii) sufficient attenuation of the undesired signal components at the first harmonic of the output sample rate, which is closest to the desired signal. The complexity of anti-alias filter 210 may be dependent on the desired signal bandwidth $f_{signal}$, the output sample rate $f_{out}$, and the desired amount of attenuation of the undesired signal components, where $f_{out}$ is dependent on the input sample rate $f_s$ and the decimation factor N. In general, it is desirable to reduce the complexity of anti-alias filter 210 as much as possible.

In an aspect, decimator 220 may be implemented with a differential switched-capacitor structure that can sample a differential input signal onto both the top/positive and bottom/negative plates of at least one sampling capacitor within the decimator. High attenuation of undesired signal components at odd harmonics of the output sample rate, including the first harmonic at $f_s/N$, may be achieved by appropriately controlling the sampling of the differential input signal onto the top and bottom plates of the sampling capacitor(s), as described below.

Figure 3B:
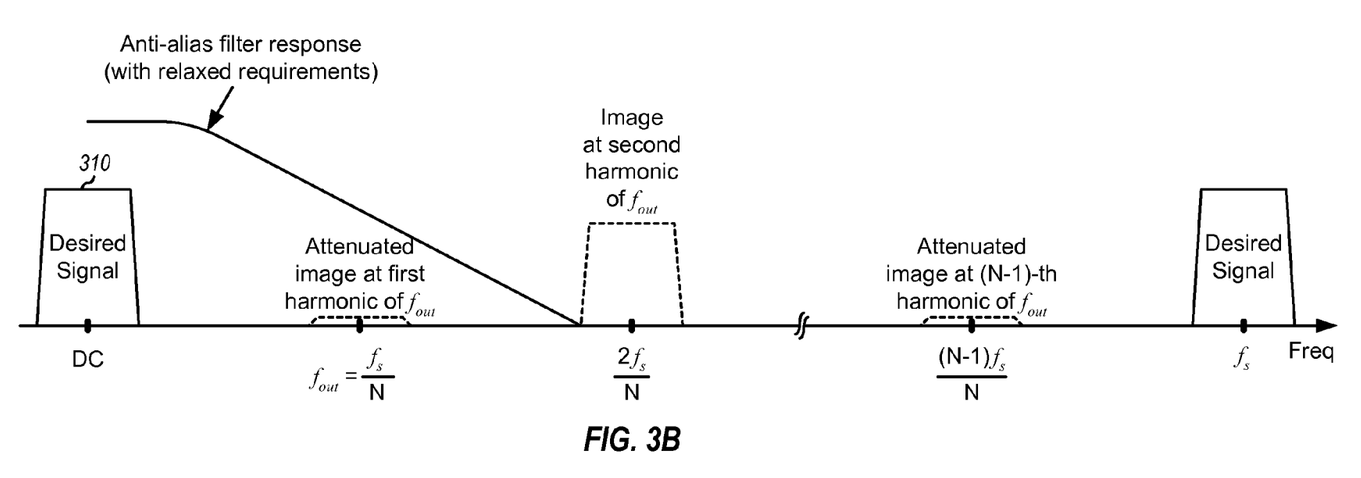
FIG. 3B shows a spectral plot for decimation with a switched-capacitor decimator.

FIG. 3B shows a spectral plot for decimation with switched-capacitor decimator 220. The odd harmonics of the output sample rate at $f_s/N$, $3f_s/N$, ..., $(N-1)f_s/N$ may be attenuated with decimator 220. Anti-alias filter 210 may then be designed to attenuate the even harmonics of the output sample rate at $2f_s/N$, $4f_s/N$, $(N-2)f_s/N$. The closest even harmonic is at $2f_s/N$ whereas the closest odd harmonic is at $f_s/N$. The requirements of anti-alias filter 210 may be relaxed by an entire octave with decimator 220. This may then reduce the complexity of anti-alias filter 210, which may result in smaller area, lower power consumption, and/or other advantages for anti-alias filter 210.

Figure 4A:
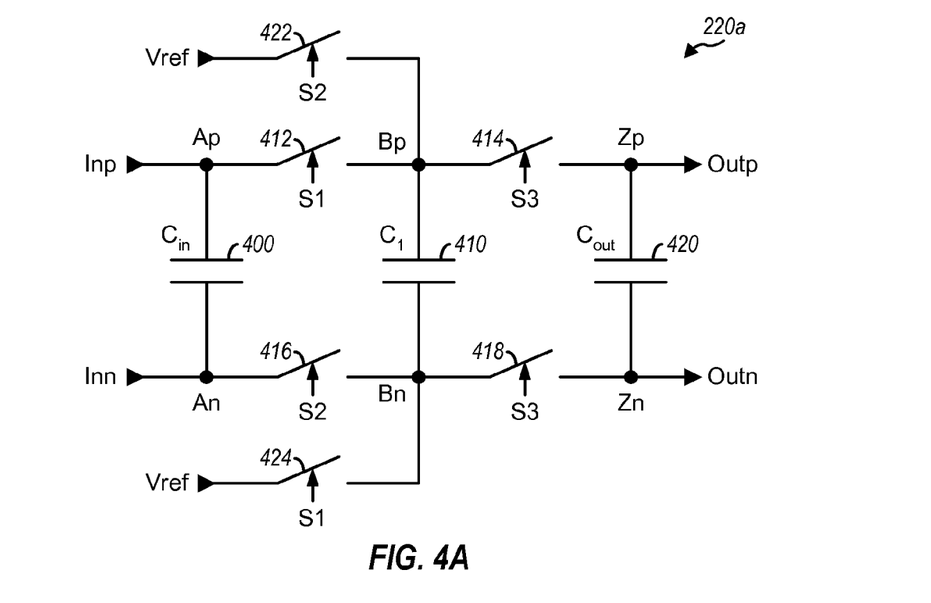
FIG. 4A shows a switched-capacitor decimator with one sampling capacitor.

FIG. 4A shows a schematic diagram of a design of a switched-capacitor decimator 220a with a single sampling capacitor. Decimator 220a is one design of decimator 220 in FIG. 2. Decimator 220a receives a differential input signal composed of the Inp and Inn signals at input nodes Ap and An, respectively. Decimator 220a decimates the input signal by a factor of N, where N may be any integer value. Decimator 220a provides a differential output signal composed of the Outp and Outn signals at output nodes Zp and Zn, respectively.

Within decimator 220a, an input capacitor 400 has its top plate coupled to node Ap and its bottom plate coupled to node An. A switch 412 is coupled between node Ap and node Bp. A switch 414 is coupled between node Bp and node Zp. A switch 422 is coupled between a reference voltage Vref and node Bp. Vref may be a common mode voltage of an input circuit that and be equal to a common voltage of an output circuit. A switch 416 is coupled between node An and node Bn. A switch 418 is coupled between node Bn and node Zn. A switch 424 is coupled between the reference voltage and node Bn. A sampling capacitor 410 has its top plate coupled to node Bp and its bottom plate coupled to node Bn. An output capacitor 420 has its top plate coupled to node Zp and its bottom plate coupled to node Zn. Switches 412, 414, 416, 418, 422 and 424 are opened and closed by control signals S1, S3, S2, S3, S2 and S1, respectively.

In the design shown in FIG. 4A, input capacitor 400 is coupled directly to the differential input signal, and output capacitor 420 is coupled directly to the differential output signal. Sampling capacitor 410 samples the differential input signal and provides its stored charges to the differential output signal. The capacitance of capacitor 400 may be selected based on various factors such as the capacitance to be presented to the preceding circuit (e.g., anti-alias filter 210), the desired voltage swing at nodes Ap and An, etc. A larger capacitor 400 corresponds to smaller voltage swing, and vice versa. Decimator 220a has a pole located at a frequency determined by the capacitances of capacitors 400 and 410 as well as the decimation factor N. The capacitance of capacitor 410 may be selected to obtain the desired frequency response for decimator 220a. The capacitance of capacitor 420 may be selected based on the subsequent circuit (e.g., filter 230) and may be smaller than the capacitance of capacitor 410 so that the voltage drop is not too great when capacitor 410 is coupled to the output.

Input capacitor 400 may also be omitted for some designs. Output capacitor 420 may also be omitted for some designs. Insertion loss may be greater without output capacitor 420.

Figure 4B:
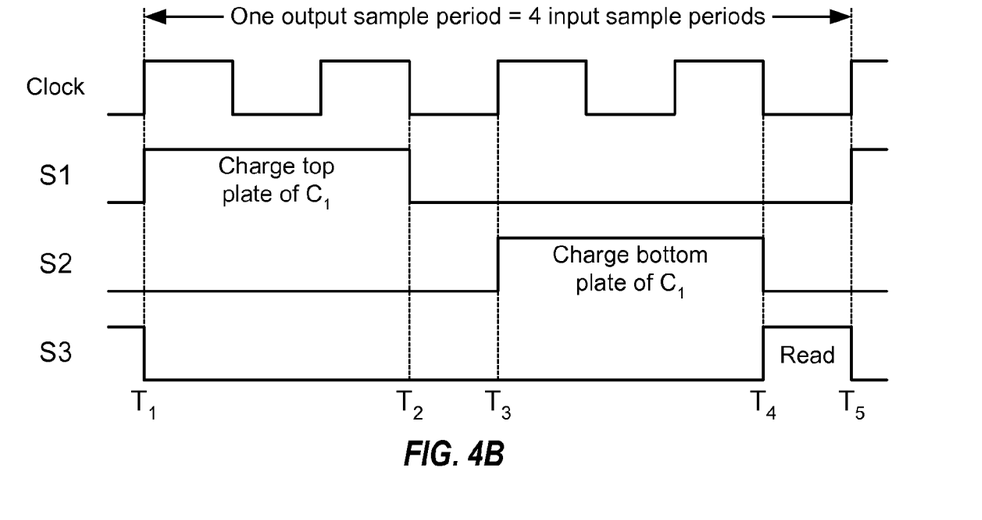
FIG. 4B shows a timing diagram for the switched-capacitor decimator in FIG. 4A.

FIG. 4B shows a timing diagram for the control signals for decimator 220a in FIG. 4A in accordance with one design for a case in which N=4. In this design, the top plate of sampling capacitor 410 is charged during a top charging phase and provides its stored charges during a reading phase. The bottom plate of sampling capacitor 410 is charged during a bottom charging phase and provides its stored charges during the reading phase.

For the top charging phase from time $T_1$ to time $T_2$, the S1 signal is asserted, switches 412 and 424 are closed, and the top plate of capacitor 410 is charged by the Inp signal with the bottom plate of capacitor 410 connected to Vref. Switch 424 maintains the bottom plate of capacitor 410 at a known voltage while the top plate of capacitor 410 is charged via switch 412. For the bottom charging phase from time $T_3$ to time $T_4$, the S2 signal is asserted, switches 416 and 422 are closed, and the bottom plate of capacitor 410 is charged by the Inn signal with the top plate of capacitor 410 connected to Vref. For the reading phase from time $T_4$ to time $T_5$, the S3 signal is asserted, switches 414 and 418 are closed, and the top and bottom plates of capacitor 410 provide their stored charges to the Outp and Outn signals, respectively.

For the design shown in FIG. 4B, at most one plate of capacitor 410 is charged or read at any given moment. The top plate reading phase should be complete while the bottom plate is charging, and vice versa. Each plate of capacitor 410 is charged and read in different non-overlapping time intervals of each output sample period.

For simplicity, FIG. 4B shows the rising and falling edges of the control signals being time aligned. The control signals may also be generated such that the rising edges occur after the falling edges, so that only one control signal is asserted at any given moment. FIG. 4B also shows each charging phase having a duration of 1.5 input sample periods and each reading phase having a duration of 0.5 input sample periods. The charging and reading phases may also have other durations. The duration of each reading phase may be sufficiently long to allow capacitor 410 to provide its stored charges to the output signal. The duration of each charging phase may be as long as possible to allow capacitor 410 to capture as much charges as possible from the input signal.

In one design that is shown in FIG. 4B, the control signals for the bottom plate of capacitor 410 may be generated as follows:

$$S_n = R_n + \frac{N}{2} \cdot T_s, \qquad \text{Eq (1)}$$

where $T_s = 1/f_s$ is one input sample period,
$R_n$ is a control signal for the top plate of a sampling capacitor,
$S_n$ is a control signal for the bottom plate of the sampling capacitor, and
n is an index for a control signal, e.g., n='a1' or 'a2' for decimator 220a.

In the design shown in equation (1), each $S_n$ signal for the bottom plate is delayed by N/2 input sample periods from a corresponding $R_n$ signal for the top plate. This results in good anti-aliasing performance and high attenuation of odd harmonics of the output sample rate, which are at $m \cdot f_s/N$, for m=1, 3, 5, ..., N−1.

In another design, each $S_n$ signal for the bottom plate may be delayed by either less than or more than N/2 (e.g., 9N/16) input sample periods from a corresponding $R_n$ signal for the top plate. This may provide both anti-aliasing and filtering of the input signal. Different amounts of delay for the $R_n$ signal may provide different amounts of attenuation of the undesired signal components as well as different filter responses.

Figure 5A:
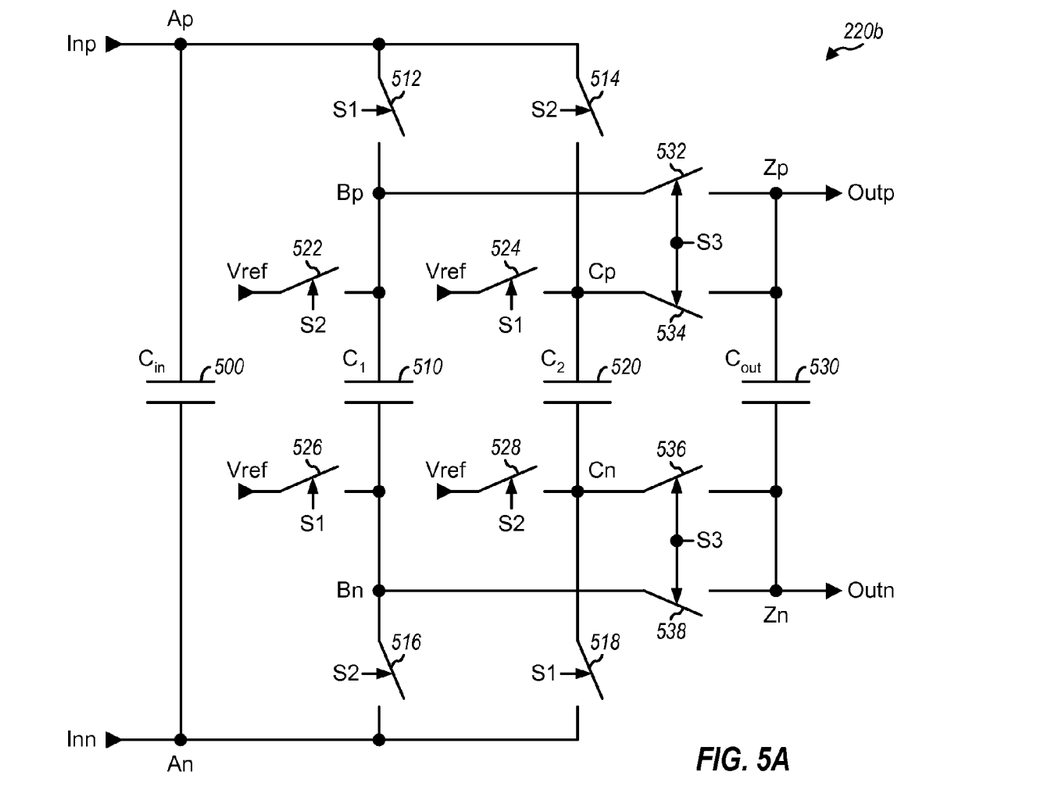
FIG. 5A shows a switched-capacitor decimator with two sampling capacitors.

FIG. 5A shows a schematic diagram of a design of a switched-capacitor decimator 220b with two sampling capacitors. Decimator 220b is another design of decimator 220 in FIG. 2. Within decimator 220b, an input capacitor 500 has its top and bottom plates coupled to input nodes Ap and An, respectively. Switches 512 and 514 have one end coupled to node Ap and the other end coupled to nodes Bp and Cp, respectively. Switches 516 and 518 have one end coupled to node An and the other end coupled to nodes Bn and Cn, respectively. Switches 522 and 526 have one end coupled to Vref and the other end coupled to nodes Bp and Bn, respectively. A sampling capacitor 510 has its top and bottom plates coupled to nodes Bp and Bn, respectively. Switches 524 and 528 have one end coupled to Vref and the other end coupled to nodes Cp and Cn, respectively. A sampling capacitor 520 has its top and bottom plates coupled to nodes Cp and Cn, respectively. Switches 532 and 534 have one end coupled to node Zp and the other end coupled to nodes Bp and Cp, respectively. Switches 536 and 538 have one end coupled to node Zn and the other end coupled to nodes Cn and Bn, respectively. An output capacitor 530 has its top and bottom plates coupled to output nodes Zp and Zn, respectively. Switches 512, 514, 516 and 518 are opened and closed by control signals S1, S2, S2 and S1, respectively. Switches 522, 524, 526 and 528 are opened and closed by control signals S2, S1, S1 and S2, respectively. Switches 532, 534, 536 and 538 are opened and closed together by a control signal S3.

In the design shown in FIG. 5A, input capacitor 500 is coupled directly to the differential input signal, and output capacitor 530 is coupled directly to the differential output signal. Input capacitor 500 and/or output capacitor 530 may be omitted for some designs. Sampling capacitors 510 and 520 sample the differential input signal and provide their stored charges to the differential output signal. Decimator 220b has a pole located at a frequency determined by the capacitances of capacitors 500, 510 and 520 as well as the decimation factor N. The capacitances of capacitors 500, 510, 520 and 530 may be selected based on the considerations described above for decimator 220a in FIG. 4A. Capacitors 510 and 520 may have the same capacitance. The capacitance of capacitor 530 may be smaller than the combined capacitance of capacitors 510 and 520 so that the voltage drop is not too great when capacitors 510 and 520 are coupled to the output.

Figure 5B:
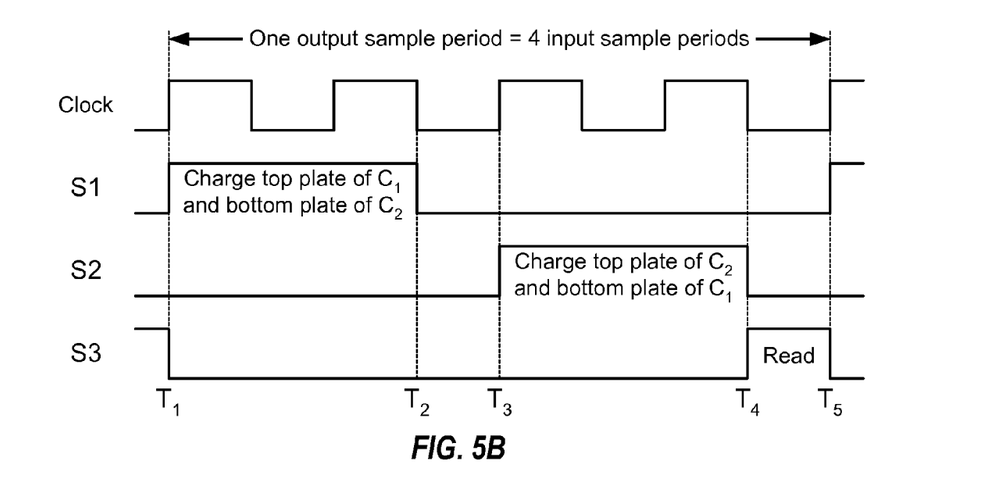
FIG. 5B shows a timing diagram for the switched-capacitor decimator in FIG. 5A.

FIG. 5B shows a timing diagram for the control signals for decimator 220b in FIG. 5A in accordance with one design for a case in which N=4. In this design, the top plates of sampling capacitors 510 and 520 are charged during two charging phases and provide their stored charges during a reading phase. The bottom plates of sampling capacitors 510 and 520 are also charged during the two charging phases and provide their stored charges during the reading phase.

For the first charging phase from time $T_1$ to time $T_2$, the S1 signal is asserted, switches 512 and 526 are closed, and the top plate of capacitor 510 is charged by the Inp signal. Switches 518 and 524 are also closed, and the bottom plate of capacitor 520 is charged by the Inn signal. For the second charging phase from time $T_3$ to time $T_4$, the S2 signal is asserted, switches 514 and 528 are closed, and the top plate of capacitor 520 is charged by the Inp signal. Switches 516 and 522 are also closed, and the bottom plate of capacitor 510 is charged by the Inn signal. For the reading phase from time $T_4$ to time $T_5$, the S3 signal is asserted, switches 532, 534, 536 and 538 are closed, the top plates of capacitors 510 and 520 provide their stored charges to the Outp signal, and the bottom plates of capacitors 510 and 520 provide their stored charges to the Outn signal.

For the design shown in FIG. 5B, the top plates of capacitors 510 and 520 are charged by the Inp signal during two non-overlapping time intervals and provide their stored charges to the Outp signal during a third non-overlapping time interval in each output sample period. The Inp signal thus charges the top plate of at most one sampling capacitor at any given moment. Similarly, the bottom plates of capacitors 510 and 520 are charged by the Inn signal during two non-overlapping time intervals and provide their stored charges to the Outn signal during a third non-overlapping time interval in each output sample period. The Inn signal thus charges the bottom plate of at most one capacitor at any given moment. For each capacitor, at most one plate is charged or read at any given moment. Each plate of each capacitor is charged and read in different non-overlapping time intervals of each output sample period.

Decimator 220b in FIG. 5A may have less insertion loss than decimator 220a in FIG. 4A. In decimator 220a, each input signal charges a single capacitor 410 in one reading phase, which has a duration of less than one half of an output sample period. In decimator 220b, each input signal alternately charges two capacitors 510 and 520 in two reading phases. These two capacitors may be able to collect more charges from the input signal over two reading phases, which may then result in less insertion loss.

Figure 6A:
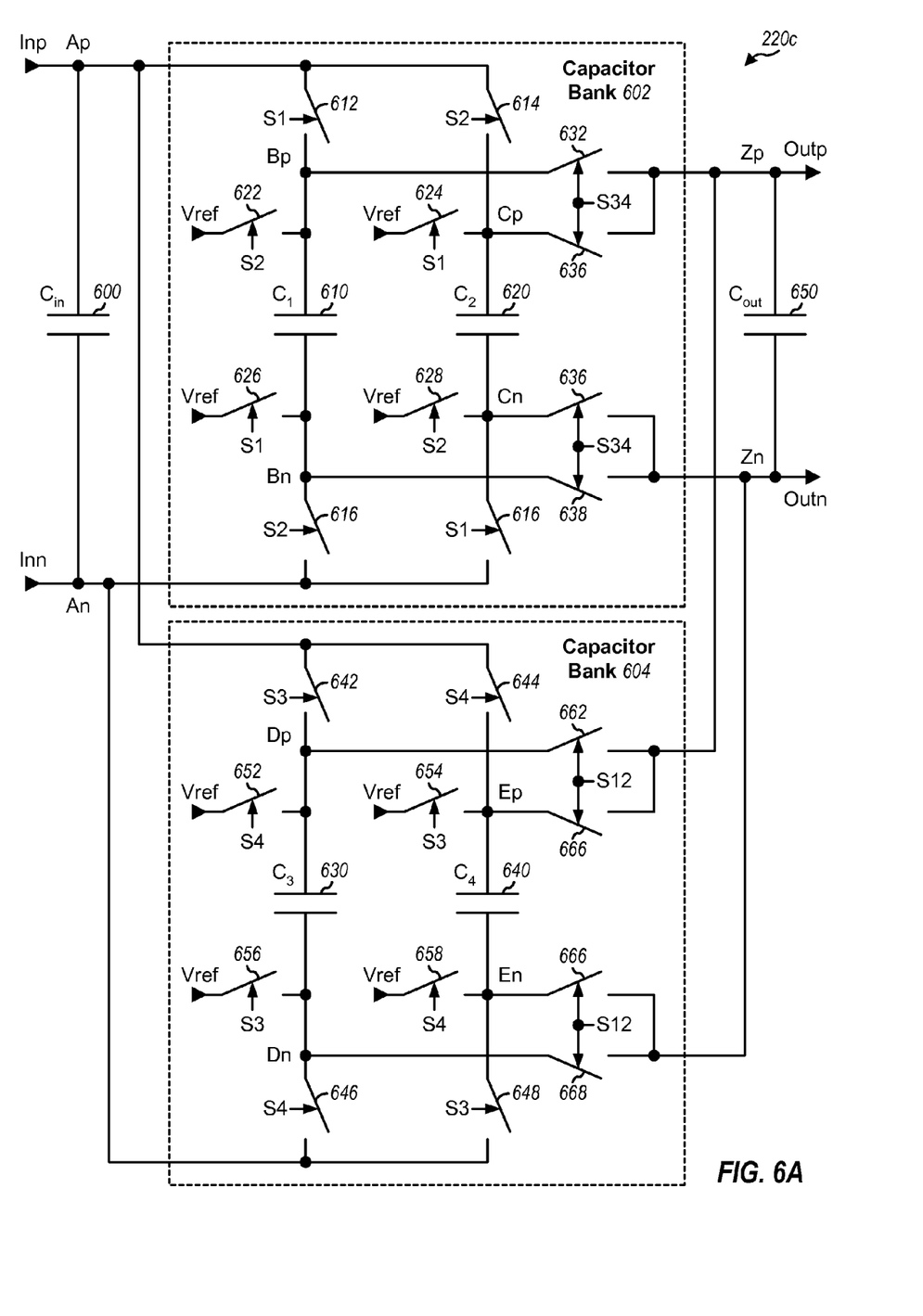
FIG. 6A shows a switched-capacitor decimator with four sampling capacitors.

FIG. 6A shows a schematic diagram of a design of a switched-capacitor decimator 220c with four sampling capacitors. Decimator 220c is yet another design of decimator 220 in FIG. 2. Decimator 220c includes an input capacitor 600, an output capacitor 650, and two capacitor banks 602 and 604. Capacitor 600 has its top and bottom plates coupled to input nodes Ap and An, respectively. Capacitor 650 has its top and bottom plates coupled to output nodes Zp and Zn, respectively.

Within first capacitor bank 602, switches 612 and 614 have one end coupled to node Ap and the other end coupled to nodes Bp and Cp, respectively. Switches 616 and 618 have one end coupled to node An and the other end coupled to nodes Bn and Cn, respectively. Switches 622 and 626 have one end coupled to Vref and the other end coupled to nodes Bp and Bn, respectively. A sampling capacitor 610 has its top and bottom plates coupled to nodes Bp and Bn, respectively. Switches 624 and 628 have one end coupled to Vref and the other end coupled to nodes Cp and Cn, respectively. A sampling capacitor 620 has its top and bottom plates coupled to nodes Cp and Cn, respectively. Switches 632 and 634 have one end coupled to node Zp and the other end coupled to nodes Bp and Cp, respectively. Switches 636 and 638 have one end coupled to node Zn and the other end coupled to nodes Cn and Bn, respectively. Switches 612, 614, 616 and 618 are opened and closed by control signals S1, S2, S2 and S1, respectively. Switches 622, 624, 626 and 628 are opened and closed by control signals S2, S1, S1 and S2, respectively. Switches 632, 634, 636 and 638 are opened and closed together by a control signal S34.

Within second capacitor bank 604, switches 642 and 644 have one end coupled to node Ap and the other end coupled nodes Dp and Ep, respectively. Switches 646 and 648 have one end coupled to node An and the other end coupled to nodes Dn and En, respectively. Switches 652 and 656 have one end coupled to Vref and the other end coupled to nodes Dp and Dn, respectively. A sampling capacitor 630 has its top and bottom plates coupled to nodes Dp and Dn, respectively. Switches 654 and 658 have one end coupled to Vref and the other end coupled to nodes Ep and En, respectively. A sampling capacitor 640 has its top and bottom plates coupled to nodes Ep and En, respectively. Switches 662 and 664 have one end coupled to node Zp and the other end coupled to nodes Dp and Ep, respectively. Switches 666 and 668 have one end coupled to node Zn and the other end coupled to nodes En and Dn, respectively. Switches 642, 644, 646 and 648 are opened and closed by control signals S3, S4, S4 and S3, respectively. Switches 652, 654, 656 and 658 are opened and closed by control signals S4, S3, S3 and S4, respectively. Switches 662, 664, 666 and 668 are opened and closed together by a control signal S12.

In the design shown in FIG. 6A, input capacitor 600 is coupled directly to the differential input signal, and output capacitor 650 is coupled directly to the differential output signal. Input capacitor 600 and/or output capacitor 650 may be omitted for some designs. Sampling capacitors 610, 620, 630 and 640 sample the differential input signal and provide their stored charges to the differential output signal. Decimator 220c has a pole located at a frequency determined by the capacitances of capacitors 600, 610, 620, 630 and 630 as well as the decimation factor N. The capacitances of capacitors 600, 610, 620, 630 and 640 may be selected based on the considerations described above for decimator 220a in FIG. 4A. Capacitors 610, 620, 630 and 640 may have the same capacitance.

Figure 6B:
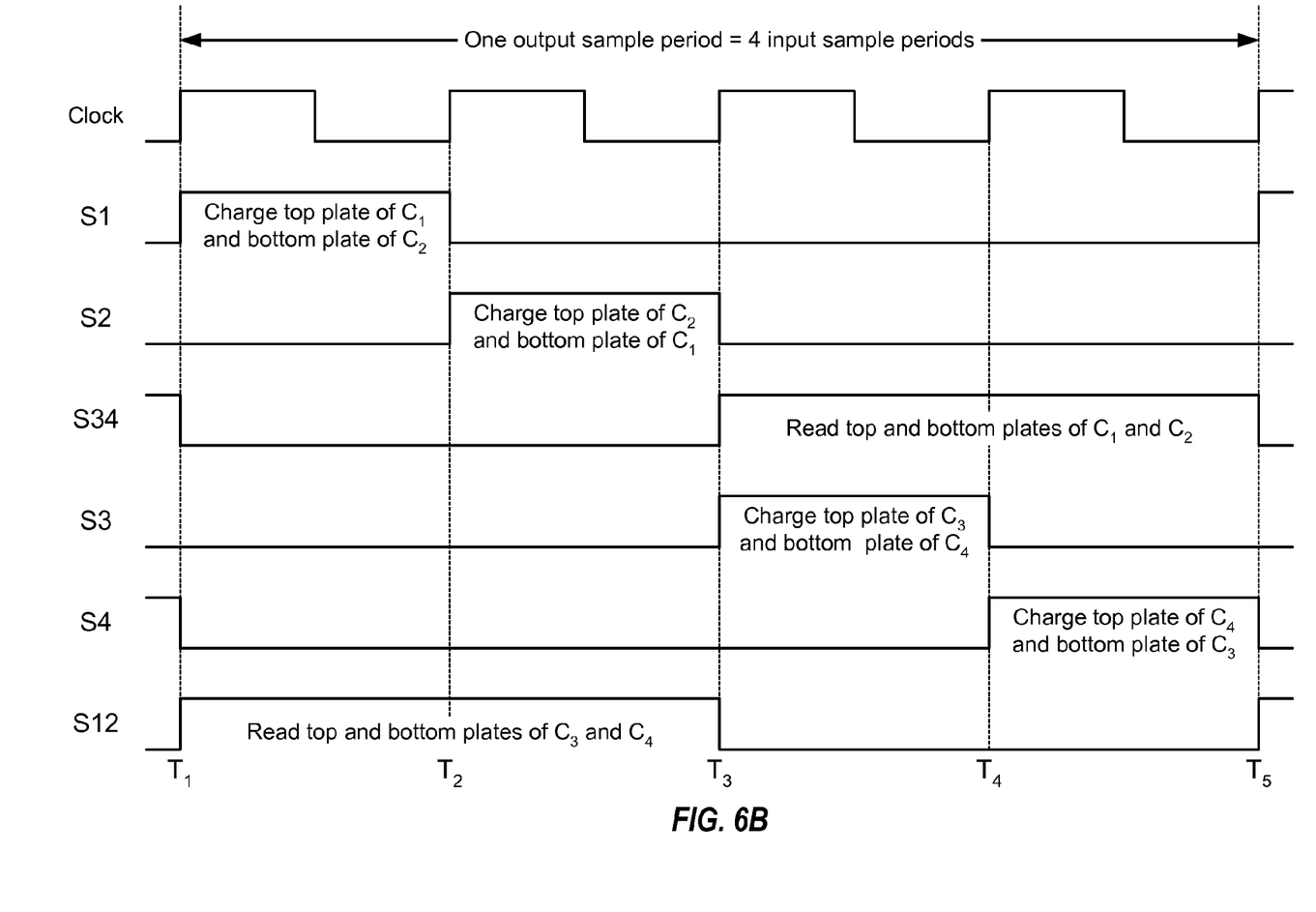
FIG. 6B shows a timing diagram for the switched-capacitor decimator in FIG. 6A.

FIG. 6B shows a timing diagram for the control signals for decimator 220c in FIG. 6A in accordance with one design for a case in which N=4. In this design, the top and bottom plates of sampling capacitors 610 and 620 are charged in the first half and are read in the second half of each output sample period. The top and bottom plates of sampling capacitors 630 and 640 are charged in the second half and are read in the first half of each output sample period. The two capacitor banks 602 and 604 operate in an interleaved manner.

For the first charging phase from time $T_1$ to time $T_2$, the S1 signal is asserted, switches 612, 616, 624 and 626 are closed, the top plate of capacitor 610 is charged by the Inp signal, and the bottom plate of capacitor 620 is charged by the Inn signal. For the second charging phase from time $T_2$ to time $T_3$, the S2 signal is asserted, switches 614, 616, 622 and 628 are closed, the bottom plate of capacitor 610 is charged by the Inn signal, and the top plate of capacitor 620 is charged by the Inp signal. For the first reading phase from time $T_3$ to time $T_5$, the S34 signal is asserted, switches 632, 634, 636 and 638 are closed, the top plates of capacitors 610 and 620 provide their stored charges to the Outp signal, and the bottom plates of capacitors 610 and 620 provide their stored charges to the Outn signal.

For the third charging phase from time $T_3$ to time $T_4$, the S3 signal is asserted, switches 642, 648, 654 and 656 are closed, the top plate of capacitor 630 is charged by the Inp signal, and the bottom plate of capacitor 640 is charged by the Inn signal. For the fourth charging phase from time $T_4$ to time $T_5$, the S4 signal is asserted, switches 644, 646, 652 and 658 are closed, the bottom plate of capacitor 630 is charged by the Inn signal, and the top plate of capacitor 640 is charged by the Inp signal. For the second reading phase from time $T_1$ to time $T_3$, the S12 signal is asserted, switches 662, 664, 666 and 668 are closed, the top and bottom plates of capacitors 630 and 640 provide their stored charges to the Outp signal, and the bottom plates of capacitors 630 and 640 provide their stored charges to the Outn signal.

For the design shown in FIG. 6B, the top plates of the four sampling capacitors 610, 620, 630 and 640 are charged by the Inp signal during four non-overlapping time intervals in each output sample period. The Inp signal thus charges the top plate of at most one capacitor at any given moment. The top plates of capacitors 610 and 620 provide their stored charges to the Outp signal during a time interval in which they are not charged. The top plates of capacitors 630 and 640 also provide their stored charges to the Outp signal during a time interval in which they are not charged. Similarly, the bottom plates of the four sampling capacitors 610, 620, 630 and 640 are charged by the Inn signal in four non-overlapping time intervals in each output sample period. The Inn signal thus charges the bottom plate of at most one capacitor at any given moment. The bottom plates of capacitors 610 and 620 provide their stored charges to the Outn signal during a time interval in which they are not charged. The bottom plates of capacitors 630 and 640 also provide their stored charges to the Outn signal during a time interval in which they are not charged. For each capacitor, at most one plate is charged or read at any given moment. Each plate of each capacitor is charged and read in different non-overlapping time intervals of each output sample period.

Decimator 220c in FIG. 6A may have less insertion loss than decimator 220b in FIG. 5A and decimator 220a in FIG. 4A. For decimator 220c, each input signal charges the four sampling capacitors 610, 620, 630 and 640 in four reading phases that may have as little gap in time as possible. These capacitors may then be able to collect as much charges as possible from the input signal, which may result in less insertion loss.

FIGS. 4A, 5A and 6A show three switched-capacitor decimator designs that can sample a differential input signal onto both top and bottom plates of at least one sampling capacitor. The switched-capacitor decimator may also be implemented with other designs, which may have different arrangement of sampling capacitors and switches.

FIGS. 4B, 5B and 6B show three example timing diagrams for the switched-capacitor decimator designs in FIGS. 4A, 5A and 6A, respectively. The control signals for the switches in the switched-capacitor decimator may also be generated in other manners to allow for charging and reading of each plate of each sampling capacitor.

In the designs shown in FIGS. 4A, 5A and 6A, input capacitors 400, 500 and 600 have fixed values that may be selected based on the considerations described above. It may be desirable to have a configurable input capacitor.

Figure 7:
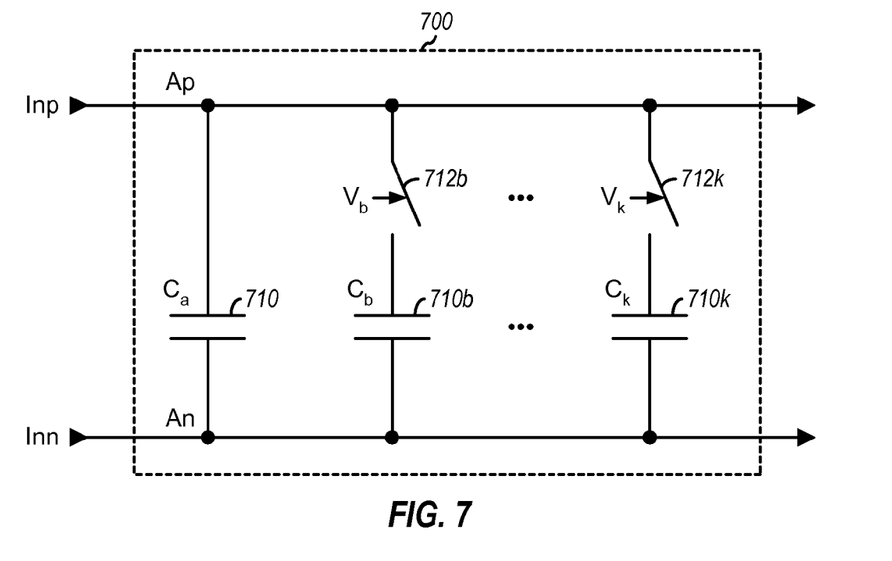
FIG. 7 shows a configurable input capacitor for a switched-capacitor decimator.

FIG. 7 shows a schematic diagram of a design of a configurable input capacitor 700, which may be used for each of input capacitors 400, 500 and 600 in FIGS. 4A, 5A and 6A, respectively. In this design, input capacitor 700 includes K capacitors 710a through 710k coupled in parallel, where in general K>1 and in one design K=2. Capacitor 710a is coupled directly between nodes Ap and An. Capacitors 710b through 710k are coupled in series with switches 712b through 712k, respectively. Each series combination of capacitor 710 and switch 712 is coupled between nodes Ap and An. Switches 712b through 712k are opened and closed by control signals Vb through Vk, respectively. Capacitors 710a through 710k may have the same or different capacitances.

In the design shown in FIG. 7, capacitor 710a is always coupled between nodes Ap and An. Each of capacitors 710b through 710k may be coupled between nodes Ap and An via a respective one of switches 712b through 712k. In another design, capacitor 710a may also be selectively coupled between nodes Ap and An via a switch.

The input capacitance across nodes Ap and An may be selected based on detected channel conditions. In general, higher input capacitance may provide more attenuation of the input signal, which may be desirable when a large blocker is detected. A blocker is an undesired signal that may be much larger than a desired signal and may be close in frequency to the desired signal. A blocker may also be referred to as a jammer. In one design, if a large blocker is detected, then one or more of capacitors 710b through 710k may be coupled between nodes Ap and An. The extra capacitor(s) may attenuate the large blocker, which may avoid saturation of subsequent circuit blocks. If a large blocker is not detected, then only capacitor 710a may be coupled between nodes Ap and An. This may provide a larger signal swing, which may reduce degradation due to noise.

Figure 8:
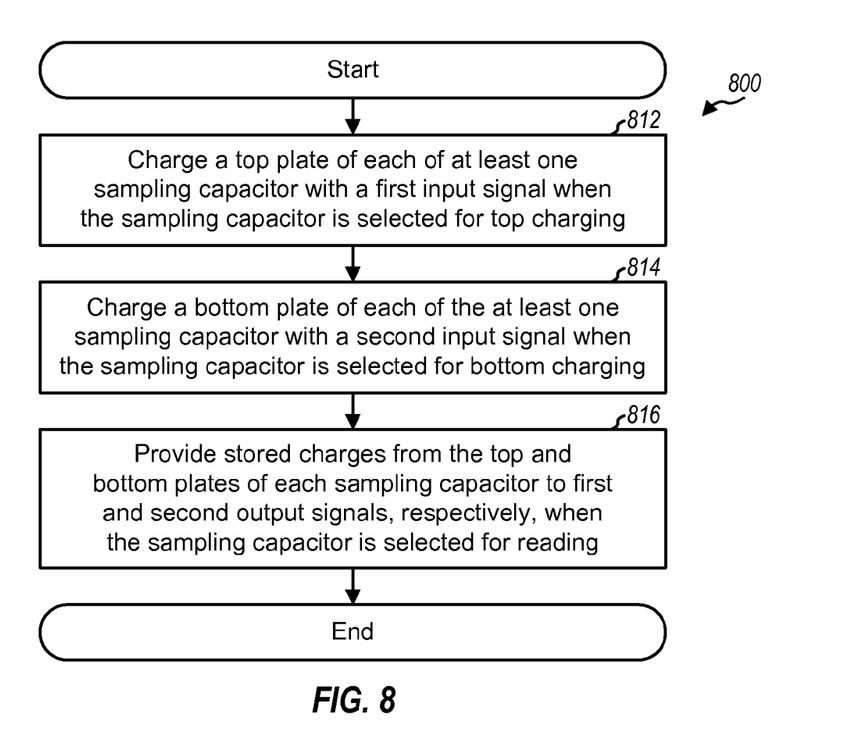
FIG. 8 shows a process for performing decimation.

FIG. 8 shows a design of a process 800 for performing decimation. A top plate of each of at least one sampling capacitor may be charged with a first input signal when the sampling capacitor is selected for top charging (block 812). A bottom plate of each of the at least one sampling capacitor may be charged with a second input signal when the sampling capacitor is selected for bottom charging (block 814). Stored charges from the top and bottom plates of each sampling capacitor may be provided to first and second output signals, respectively, when the sampling capacitor is selected for reading (block 816).

For each sampling capacitor, the top plate may be charged in a first time interval, and the bottom plate may be charged in a second time interval. The first and second time intervals may have equal duration. In one design, the second time interval may be delayed by one half of an output sample period from the first time interval. In another design, the second time interval may be delayed by less than one half of an output sample period from the first time interval.

The top plate of the at least one sampling capacitor may be charged in at least one non-overlapping first time interval in each output sample period, one first time interval for each sampling capacitor. The bottom plate of the at least one sampling capacitor may be charged in at least one non-overlapping second time interval in each output sample period, one second time interval for each sampling capacitor. For each sampling capacitor, the first time interval for charging the top plate may be non-overlapping with the second time interval for charging the bottom plate. The top and bottom plates of each sampling capacitor may be coupled to the first and second output signals, respectively, in a time interval that is non-overlapping with first and second time intervals used to charge that sampling capacitor.

In one design, multiple sampling capacitors are used. The top plates of the multiple sampling capacitors may be charged in multiple non-overlapping time intervals in each output sample period, one time interval for each sampling capacitor. The bottom plates of the multiple sampling capacitors may be charged in the multiple non-overlapping time intervals in each output sample period, one time interval for each sampling capacitor. For each sampling capacitor, the time interval for charging the top plate may be non-overlapping with the time interval for charging the bottom plate, and the time interval for reading the top and bottom plates may be non-overlapping with the time intervals for charging the top and bottom plates.

The switched-capacitor decimator described herein may be implemented on an IC, an analog IC, an RFIC, a mixed-signal IC, an ASIC, a printed circuit board (PCB), an electronics device, etc. The switched-capacitor decimator may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the switched-capacitor decimator described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a switched-capacitor decimator operative to receive a differential input signal comprising first and second input signals at an input sample rate and to provide first and second output signals at an output sample rate lower than the input sample rate, the switched-capacitor decimator comprising:
   at least one sampling capacitor, each sampling capacitor having a top plate charged with the first input signal when the sampling capacitor is selected for top charging and a bottom plate charged with the second input signal when the sampling capacitor is selected for bottom charging, wherein only the top plate or the bottom plate is being charged at any given time, and wherein the top and bottom plates of each sampling capacitor providing stored charges to the first and second output signals, respectively, when the sampling capacitor is selected for reading;
   a plurality of switches operative to couple the at least one sampling capacitor to the first and second input signals for charging and to the first and second output signals for reading; and
   an input capacitor coupled between the first input signal and to the second input signal.

2. The apparatus of claim 1, wherein the first and second output signals are for a differential output signal.

3. The apparatus of claim 1, wherein the at least one sampling capacitor comprises a single sampling capacitor, and wherein the plurality of switches comprise
   a first switch operative to couple the first input signal to the top plate of the sampling capacitor when selected for top charging, a second switch operative to couple the second input signal to the bottom plate of the sampling capacitor when selected for bottom charging, a third switch operative to couple the top plate of the sampling capacitor to the first output signal when selected for reading, and a fourth switch operative to couple the bottom plate of the sampling capacitor to the second output signal when selected for reading.

4. The apparatus of claim 1, wherein the at least one sampling capacitor comprises first and second sampling capacitors, and wherein the plurality of switches comprise first and second switches operative to couple the first input signal to top plates of the first and second sampling capacitors, respectively, when selected for top charging, third and fourth switches operative to couple the second input signal to bottom plates of the first and second sampling capacitors, respectively, when selected for bottom charging, fifth and sixth switches operative to couple the top plates of the first and second sampling capacitors, respectively, to the first output signal when selected for reading, and seventh and eight switches operative to couple the bottom plates of the first and second sampling capacitors, respectively, to the second output signal when selected for reading.

5. The apparatus of claim 1, wherein the at least one sampling capacitor comprises first, second, third and fourth sampling capacitors, and wherein the plurality of switches comprise first, second, third and fourth switches operative to couple the first input signal to top plates of the first, second, third and fourth sampling capacitors, respectively, when selected for top charging, fifth, sixth, seventh and eight switches operative to couple the second input signal to bottom plates of the first, second, third and fourth sampling capacitors, respectively, when selected for bottom charging, ninth, tenth, eleventh and twelfth switches operative to couple the top plates of the first, second, third and fourth sampling capacitors, respectively, to the first output signal when selected for reading, and thirteenth, fourteenth, fifteenth and sixteenth switches operative to couple the bottom plates of the first, second, third and fourth sampling capacitors, respectively, to the second output signal when selected for reading.

6. The apparatus of claim 5, wherein the top plates of the first, second, third and fourth sampling capacitors are charged in first, second, third and fourth non-overlapping time intervals, respectively, in each output sample period, and wherein the bottom plates of the first, second, third and fourth sampling capacitors are charged in the second, first, fourth and third time intervals, respectively, in each output sample period.

7. The apparatus of claim 6, wherein the top plates of the first and second sampling capacitors are coupled to the first output signal and the bottom plates of the third and fourth sampling capacitors are coupled to the second output signal in at least one of the third and fourth time intervals, and wherein the top plates of the third and fourth sampling capacitors are coupled to the first output signal and the bottom plates of the first and second sampling capacitors are coupled to the second output signal in at least one of the first and second time intervals.

8. The apparatus of claim 1, wherein the input capacitor is selectively coupled and decoupled between the first and second input signals.

9. The apparatus of claim 8, wherein the input capacitor further comprises a plurality of supplemental input capacitors selectively coupled in parallel via serial switches and decoupling, wherein the total capacitance of the input capacitor varies depending upon which of the plurality of supplemental input capacitors are coupled together, and wherein the total capacitance of the input capacitor is selected to be increased when a larger blocker is detected and is reduced when a larger blocker is not detected.

10. The apparatus of claim 1, wherein the switched-capacitor decimator further comprises an output capacitor coupled between the first and second output signals.

11. The apparatus of claim 1, wherein for each sampling capacitor the top plate is charged in a first time interval and the bottom plate is charged in a second time interval, the second time interval being delayed by one half of an output sample period from the first time interval.

12. The apparatus of claim 1, wherein for each sampling capacitor the top plate is charged in a first time interval and the bottom plate is charged in a second time interval, the second time interval being delayed by less than one half of an output sample period from the first time interval.

13. The apparatus of claim 1, wherein the top plate of the at least one sampling capacitor is charged in at least one non-overlapping first time interval in each output sample period, one first time interval for each sampling capacitor, and wherein the bottom plate of the at least one sampling capacitor is charged in at least one non-overlapping second time interval in each output sample period, one second time interval for each sampling capacitor.

14. The apparatus of claim 13, wherein for each sampling capacitor the first time interval for charging the top plate is non-overlapping with the second time interval for charging the bottom plate.

15. The apparatus of claim 13, wherein in each output sample period the top plate of the at least one sampling capacitor is coupled to the first output signal and the bottom plate of the at least one sampling capacitor is coupled to the second output signal in a third time interval that is non-overlapping with the at least one first time interval and the at least one second time interval.

16. The apparatus of claim 1, wherein the at least one sampling capacitor comprises multiple sampling capacitors, wherein the top plates of the multiple sampling capacitors are charged in multiple non-overlapping time intervals in each output sample period, one time interval for each sampling capacitor, wherein the bottom plates of the multiple sampling capacitors are charged in the multiple non-overlapping time intervals in each output sample period, one time interval for each sampling capacitor, and wherein for each sampling capacitor the time interval for charging the top plate is non-overlapping with the time interval for charging the bottom plate.

17. The apparatus of claim 1, wherein the switched-capacitor decimator further comprises, for each sampling capacitor, a first switch coupled to a top plate of the sampling capacitor and operative to couple the top plate to a reference voltage when a bottom plate of the sampling capacitor is being charged, and a second switch coupled to the bottom plate of the sampling capacitor and operative to couple the bottom plate to the reference voltage when the top plate of the sampling capacitor is being charged.

18. An integrated circuit comprising:

a switched-capacitor decimator operative to receive a differential input signal comprising first and second input signals at an input sample rate and to provide first and second output signals at an output sample rate lower than the input sample rate, the switched-capacitor decimator comprising:
  at least one sampling capacitor, each sampling capacitor having a top plate charged with the first input signal when the sampling capacitor is selected for top charging and a bottom plate charged with the second input signal when the sampling capacitor is selected for bottom charging, wherein only the top plate or the bottom plate is being charged at any given time, and wherein the top and bottom plates of each sampling capacitor providing stored charges to the first and second output signals, respectively, when the sampling capacitor is selected for reading;
  a plurality of switches operative to couple the at least one sampling capacitor to the first and second input signals for charging and to the first and second output signals for reading; and
  an input capacitor coupled between the first input signal and the second input signal.

19. The integrated circuit of claim 18, wherein the at least one sampling capacitor comprises a single sampling capacitor, and wherein the plurality of switches comprise
  a first switch operative to couple the first input signal to the top plate of the sampling capacitor when selected for top charging,
  a second switch operative to couple the second input signal to the bottom plate of the sampling capacitor when selected for bottom charging,
  a third switch operative to couple the top plate of the sampling capacitor to the first output signal when selected for reading, and
  a fourth switch operative to couple the bottom plate of the sampling capacitor to the second output signal when selected for reading.

20. The integrated circuit of claim 18, wherein the at least one sampling capacitor comprises first and second sampling capacitors, and wherein the plurality of switches comprise
  first and second switches operative to couple the first input signal to top plates of the first and second sampling capacitors, respectively, when selected for top charging,
  third and fourth switches operative to couple the second input signal to bottom plates of the first and second sampling capacitors, respectively, when selected for bottom charging,
  fifth and sixth switches operative to couple the top plates of the first and second sampling capacitors, respectively, to the first output signal when selected for reading, and
  seventh and eight switches operative to couple the bottom plates of the first and second sampling capacitors, respectively, to the second output signal when selected for reading.

21. The integrated circuit of claim 18, wherein the at least one sampling capacitor comprises first, second, third and fourth sampling capacitors, and wherein the plurality of switches comprise
  first, second, third and fourth switches operative to couple the first input signal to top plates of the first, second, third and fourth sampling capacitors, respectively, when selected for top charging,
  fifth, sixth, seventh and eight switches operative to couple the second input signal to bottom plates of the first, second, third and fourth sampling capacitors, respectively, when selected for bottom charging,
  ninth, tenth, eleventh and twelfth switches operative to couple the top plates of the first, second, third and fourth sampling capacitors, respectively, to the first output signal when selected for reading, and
  thirteenth, fourteenth, fifteenth and sixteenth switches operative to couple the bottom plates of the first, second, third and fourth sampling capacitors, respectively, to the second output signal when selected for reading.

22. The integrated circuit of claim 18, wherein the top plate of the at least one sampling capacitor is charged in at least one non-overlapping first time interval in each output sample period, one first time interval for each sampling capacitor, wherein the bottom plate of the at least one sampling capacitor is charged in at least one non-overlapping second time interval in each output sample period, one second time interval for each sampling capacitor, and wherein for each sampling capacitor the first time interval for charging the top plate is non-overlapping with the second time interval for charging the bottom plate.

23. An apparatus comprising:
  an anti-alias filter operative to filter an analog signal and provide a differential input signal comprising first and second input signals;
  a switched-capacitor decimator coupled to the anti-alias filter and operative to receive the differential input signal at an input sample rate and to provide a differential output signal comprising first and second output signals at an output sample rate lower than the input sample rate, the switched-capacitor decimator comprising at least one sampling capacitor, each sampling capacitor having a top plate charged with the first input signal when the sampling capacitor is selected for top charging and a bottom plate charged with the second input signal when the sampling capacitor is selected for bottom charging, wherein only the top plate or the bottom plate is being charged at any given time, and wherein the top and bottom plates of each sampling capacitor providing stored charges to the first and second output signals, respectively, when the sampling capacitor is selected for reading;
  a plurality of switches operative to couple the at least one sampling capacitor to the first and second input signals for charging and to the first and second output signals for reading; and
  an input capacitor coupled between the first input signal and the second input signal.

24. The apparatus of claim 23, wherein the anti-alias filter is operative to attenuate undesired signal components at second harmonic of the output sample rate by a target amount and to attenuate undesired signal components at first harmonic of the output sample rate by less than the target amount.

25. The apparatus of claim 23, further comprising:
  a discrete time filter coupled to the switched-capacitor decimator and operative to filter the differential output signal and provide a filtered signal.

26. A method of performing decimation on a differential input signal comprising first and second input signals at an input sample rate to obtain a differential output signal comprising first and second output signals at an output sample rate, the method comprising:
  charging a top plate of each of at least one sampling capacitor with the first input signal when the sampling capacitor is selected for top charging;
  charging a bottom plate of each of the at least one sampling capacitor with the second input signal when the sampling capacitor is selected for bottom charging; and providing stored charges from the top and bottom plates of each sampling capacitor to the first and second output signals, respectively, when the sampling capacitor is selected for reading, wherein top charging and bottom charging are not coincident, wherein the output sample rate is lower than the input sample rate, wherein each sampling capacitor is coupled to the first and second output signals by a plurality of switches, and wherein an input capacitor is coupled between the first input signal and the second input signal.

27. The method of claim 26, wherein for each sampling capacitor the top plate is charged in a first time interval and the bottom plate is charged in a second time interval, the second time interval being delayed by one half of an output sample period from the first time interval.

28. The method of claim 26, wherein the top plate of the at least one sampling capacitor is charged in at least one non-overlapping first time interval in each output sample period, one first time interval for each sampling capacitor, and wherein the bottom plate of the at least one sampling capacitor is charged in at least one non-overlapping second time interval in each output sample period, one second time interval for each sampling capacitor.

29. The method of claim 28, wherein the stored charges from the top and bottom plates of each sampling capacitor are provided to the first and second output signals, respectively, in a time interval that is non-overlapping with first and second time intervals for charging the top and bottom plates of the sampling capacitor.

30. An apparatus for performing decimation on a differential input signal comprising first and second input signals at an input sample rate to obtain a differential output signal comprising first and second output signals at an output sample rate, the apparatus comprising:

means for charging a top plate of each of at least one sampling capacitor with the first input signal when the sampling capacitor is selected for top charging;

means for charging a bottom plate of each of the at least one sampling capacitor with the second input signal when the sampling capacitor is selected for bottom charging; and means for providing stored charges from the top and bottom plates of each sampling capacitor to the first and second output signals, respectively, when the sampling capacitor is selected for reading, wherein top charging and bottom charging are not coincident, wherein the output sample rate is lower than the input sample rate, wherein each sampling capacitor is coupled to the first and second output signals by a plurality of switches, and wherein an input capacitor is coupled between the first input signal and the second input signal.

* * * * *